United States Patent [19]

Havlicsek

[11] Patent Number: 5,463,393

[45] Date of Patent: Oct. 31, 1995

[54] METHOD AND APPARATUS FOR CORRECTING ERRORS IN AN AMPLITUDE ENCODED SIGNAL

[75] Inventor: Howard S. Havlicsek, Pittsburgh, Pa.

[73] Assignee: Acutronic AG, Switzerland

[21] Appl. No.: 243,549

[22] Filed: May 13, 1994

Related U.S. Application Data

[63] Continuation of Ser. No. 802,495, Dec. 5, 1991, abandoned.

[51] Int. Cl.$^6$ .............................. H03M 1/48; H03M 1/64
[52] U.S. Cl. .......................................................... 341/115
[58] Field of Search ................................ 341/115, 111, 341/112, 113, 114, 116, 117; 318/600, 603, 605, 608

[56] References Cited

U.S. PATENT DOCUMENTS

| | | | |
|---|---|---|---|
| 2,467,646 | 4/1949 | Agins | 235/61 |
| 3,619,770 | 11/1971 | Forster | 324/40 |
| 3,631,469 | 12/1971 | Levy | 341/115 |
| 3,786,459 | 1/1974 | Berger | 340/196 |
| 3,808,560 | 4/1974 | Gassmann | 332/44 |
| 4,057,754 | 11/1977 | Pattantyus-Abraham et al. | 324/207 |
| 4,079,374 | 3/1978 | Cox | 341/115 |
| 4,149,168 | 4/1979 | Hose | 343/112 D |
| 4,369,405 | 1/1983 | Sato et al. | 324/174 |
| 4,423,635 | 1/1984 | Senicourt et al. | 73/593 |
| 4,567,462 | 1/1986 | Leiby | 340/347 |
| 4,594,540 | 6/1986 | Currie et al. | 318/661 |
| 4,951,300 | 8/1990 | Koike | 377/17 |
| 5,134,404 | 7/1992 | Peterson | 341/116 |

*Primary Examiner*—Brian K. Young
*Attorney, Agent, or Firm*—Ostrolenk, Faber, Gerb & Soffen

[57] ABSTRACT

A method and apparatus for determining the nature of an error in an amplitude encoded periodic signal and for compensating for such errors. The method includes receiving two such amplitude encoded periodic signals, each periodic signal having a sinusoidal amplitude component signal, the sinusoidal amplitude component signals being quadrature related. The method further includes squaring the two quadrature related sinusoidal amplitude component signals, summing the squared signals, and utilizing the sum signal to compensate at least one of the two sinusoidal amplitude component signals. The sum signal can be manually or automatically monitored. The sum signal can be displayed on an oscilloscope display device and at least one of the amplitude component signals compensated so as to reduce the error signal by providing a compensation signal to at least one amplitude component signal so as to obtain a substantially constant value display of the sum signal.

52 Claims, 5 Drawing Sheets

FIG. 8b

METHOD AND APPARATUS FOR CORRECTING ERRORS IN AN AMPLITUDE ENCODED SIGNAL

This is a continuation of application Ser. No 07/802,495 filed on Dec. 5, 1991, abandoned.

BACKGROUND OF THE INVENTION

The present invention relates to a method and apparatus for determining the presence of and correcting and compensating for errors in amplitude encoded signals, and particularly, amplitude encoded angular position signals.

Typically, amplitude encoded angular position signals are generated by angular position encoders which determine the angular position of, for example, a shaft, with respect to a reference angle, through a mathematical computation from two amplitude modulated signals wherein the amplitudes are quadrature related (90° out of phase) sinusoidal signals. Conventionally, an input periodic signal sin wt is provided to an input coil of the position encoder. Two output coils generate respective output signals ($A_1$ sin $\Theta_m$) sin wt and ($A_2$ cos $\Theta_m$) sin wt in response to rotation of the shaft. A sinusoidal function of the shaft angular position $\Theta_m$ thus amplitude modulates the periodic signal sin wt. In the absence of any errors or any inaccuracies in the angular position encoder and the circuitry coupled thereto, ideally $A_1=A_2$, and therefore, one can determine the angular position $\Theta_m$ as the Arctan (sin $\Theta_m$/cos $\Theta_m$). If errors are present, for example, due to manufacturing tolerances in the position encoder, one might have two different gains in the two output channels, an offset between the channels or cross coupling between the two channels. This may make $A_1 \neq A_2$ and may provide other added error terms to the channel output signals, for example, offset errors between the two signals from the output coils of the position encoder or second order error signals, e.g., due to cross coupling or gain difference.

SUMMARY OF THE INVENTION

It is an object of the present invention to provide a method and apparatus for determining when errors are present in amplitude encoded signals.

It is another object to provide a method and apparatus for determining when errors are present in the output signals from angular position encoders.

It is yet still another object of the present invention to provide a method and apparatus for correcting for errors determined to be present in the signals from an angular position encoder.

It is yet still a further object of the present invention to provide a method and apparatus for correcting for errors present in angular position encoders which can be adapted to both hardware and software implementation.

It is yet still a further object of the present invention to provide such a method and apparatus for determining and compensating for errors in amplitude encoded signals which can be utilized both manually or with automated techniques to compensate for such errors.

It is yet still another object of the invention to provide a method and apparatus for determining and compensating for errors in angular position signals which do not require an external reference.

The above and other objects of the present invention are achieved by a method for determining and correcting for an error in an amplitude encoded periodic signal, comprising receiving two such amplitude encoded periodic signals, each periodic signal having a sinusoidal amplitude component signal, the sinusoidal amplitude component signals being quadrature related, squaring the quadrature related sinusoidal amplitude component signals to produce two squared signals, summing the squared signals to produce a sum signal, and utilizing the sum signal to determine if an error is present, and if so, to compensate at least one of the two sinusoidal amplitude component signals for the error.

According to one aspect of the invention, the step of utilizing comprises monitoring the sum signal and manually compensating at least one of the two sinusoidal amplitude component signals for the error.

According to another aspect of the invention, the step of utilizing comprises automatically monitoring the sum signal and automatically compensating at least one of the two sinusoidal amplitude component signals.

The errors that can be determined and corrected may comprise, without limitation, an offset error, a gain difference error and cross coupling error between said two amplitude encoded periodic signals.

According to still another aspect of the invention, the amplitude encoded periodic signal is a position signal from an angular position encoder having a cycle and the step of utilizing the sum signal comprises comparing the sum signal to a predetermined reference value at specific times during the cycle of the angular position encoder and storing compensation values at each of said specific times for correcting at least one of the two sinusoidal amplitude component signals.

According to yet another aspect of the invention, the invention further comprises monitoring the sum signal by displaying the sum signal on an oscilloscope display device, an a the step of utilizing further comprises providing a compensation signal to at least one of the two sinusoidal amplitude component signals to reduce the display on the display device substantially to a straight line.

The above and other objects of the invention are also achieved by an apparatus for determining and correcting for an error in an amplitude encoded periodic signal comprising means for receiving two such amplitude encoded periodic signals, each periodic signal having a sinusoidal amplitude component signal, the sinusoidal amplitude component signals being quadrature related, means for squaring the sinusoidal amplitude component signals to produce two squared signals, means for summing the squared signals to produce a sum signal, and means utilizing the sum signal to determine if an error is present, and if so, to compensate at least one of the two sinusoidal amplitude component signals for the error.

Other features and advantages of the present invention will become apparent from the following description which refers to the accompanying drawings.

BRIEF DESCRIPTION OF THE DRAWINGS

The invention will now be described in greater detail in the following detailed description with reference to the drawings, in which.

DETAILED DESCRIPTION OF THE DRAWINGS

Figure 1:
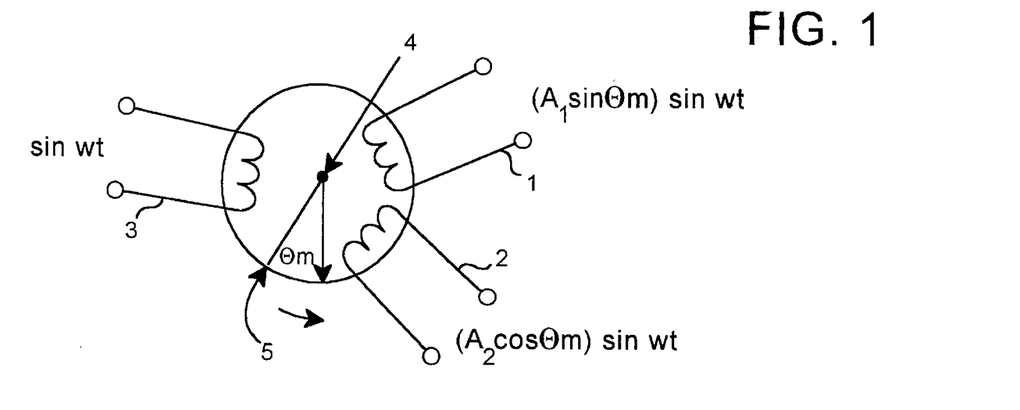
FIG. 1 shows, schematically, a typical angular position encoder.

With reference now to the drawings, FIG. 1 is a schematic diagram showing a typical angular position encoder, for example, an Inductosyn, manufactured by Inductosyn International Corp. The angular position encoder has an input coil 3 and two output coils 1 and 2. The angular position encoder determines the angular position $\Theta_m$ of a shaft 4, based upon a reference angle 5. Conventionally, an input periodic signal sin wt is applied to the input coil 3 of the position encoder. As the shaft rotates, the two output coils 1 and 2 generate respective ideal output signals ($A_1 \sin \Theta_m$) sin wt and ($A_2 \cos \Theta_m$) sin wt. A sinusoidal function of the angular position $\Theta_m$ of the shaft with respect to the reference position thus amplitude modulates the periodic signal sin wt. In the absence of any errors, intolerances or inaccuracies in the angular position encoder, $A_1 = A_2$ and therefore the angular position $\Theta_m$ is determined as the Arctan ($\sin \Theta_m / \cos \Theta_m$). If errors are present, for example, due to manufacturing intolerances in the position encoder or errors caused by the circuitry or wiring connected to the encoder, error terms will be present. For example, the gains may be different in the two output channels, cross coupling occurs between the two output channels or offset errors occur in the two output channels. The amplitude signals $E_1$ and $E_2$ from the output channels will be influenced by these error sources and will appear as follows:

$E_1 = A*\sin\Theta_m + \text{OFFsin} + A*\text{COUPLING}*\cos\Theta_m;$ $E_2 = A(1+\text{GAIN})*\cos\Theta_m + \text{OFFcos} + A*\text{COUPLING}*\sin\Theta_m.$ (1)

The terms OFFsin and OFFcos are constant value offset errors; the term (1+GAIN) is a gain error caused by different gains between the two channels expressed as a delta gain; and the terms COUPLING*$\cos\Theta_m$ and COUPLING*$\sin\Theta_m$ are coupling errors caused by interaction between the two channels, e.g., capacitive or inductive coupling.

The invention makes use of the relationship that $\sin^2 \Theta_m + \cos^2 \Theta_m = 1$ or $A^2 \sin^2\Theta_m + A^2 \cos^2 \Theta_m = A^2$. Typically, if one plots the $\sin^2 + \cos^2$ versus the angle, one would draw out a perfect circle in a polar coordinate system. If one plots the magnitude, of course, since it is the radius of a circle, it would plot out as a straight line over time or against the position angle in a rectangular coordinate system. If there is an error, however, then the sum of the squared output signals will not plot out to a constant value over time, but might take the form of some other nonconstant signal, for example, a periodic signal. From the nature of the sum of the squared output signals, one can determine the type of error present in the angular position encoder, and use the signal to compensate the angular position encoder for the error. For example, if the gains in the two channels are different, then a gain adjustment can be made in at least one of the two channels so that the outputs are the same. If there is an offset error, one can add or subtract a constant value to at least one of the two channels to compensate for such an error.

Accordingly, given the equations (1) above showing how the error signals affect the outputs from the two channels of the angular position encoder, one can form the phasor amplitude squared (the sum of the squares of the amplitudes) as $p^2 = E_1^2 + E_2^2$.

After squaring the terms and adding, all error product terms may be assumed negligible and the resultant effect of error sources on the square of the phasor amplitude is as follows:

$P^2 = A^2 + 2*A*\text{OFFsin}*\sin\Theta_m + 2*A*\text{OFFcos}*\cos\Theta_m +$ (2)

$A^2*\text{GAIN}*\cos(2\Theta_m)/2 + 2*A^2*\text{COUPLING}*\sin(2\Theta_m)$

Note that all four error terms of the square of the phasor amplitude have first order sensitivities to their corresponding measurement error sources, and that the effects of each error source are independent of the other error sources. The gain and cross coupling errors exhibit second harmonic characteristics while the offset errors are at the fundamental frequency.

The various error sources produce systematic encoding errors that are traditionally measured using an independent metrological reference. The position error is determined as $\Theta e = \Theta p - \Theta\text{ref}$, and is not an easy measurement to make.

The calibration technique according to the invention determines position errors, or at least a good approximation, without the need of an external reference. This is accomplished in the invention using the phasor magnitude information that is inherent in the signals from the angular position encoder. There is a deterministic relationship between the phase angle errors and the modulation of the phasor amplitude. The phasor amplitude can be computed in real time, according to the invention, to monitor the static phasor errors. The harmonic shape and amplitude of the signal $p^2$ reveals the nature of the encoding errors.

Figure 6:
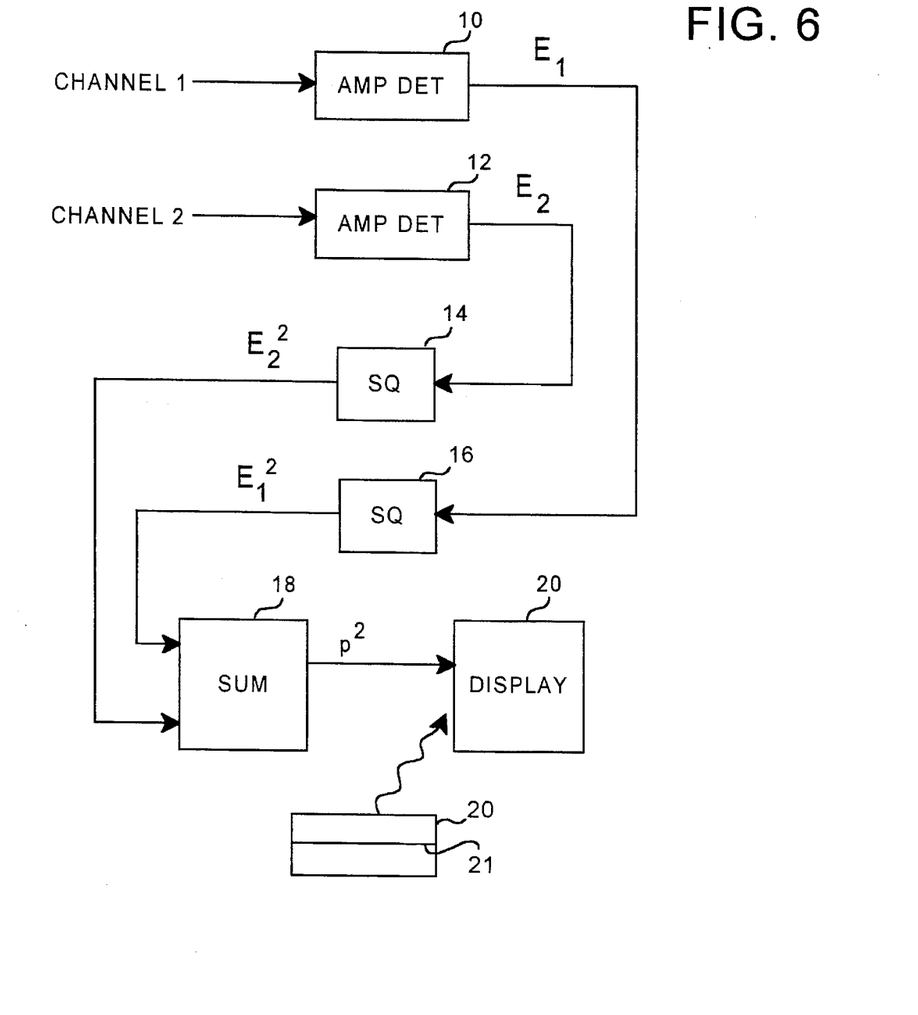
FIG. 6 shows an implementation of a system for determining and compensating for errors in an angular position encoder according to the present invention.

The system can be operated in a manual mode, or automatically. FIG. 6 shows one implementation of a system according to the invention which uses manual compensation for the error sources. In FIG. 6, the outputs from the two output coils 1 and 2 of the angular position encoder are fed to amplitude detectors 10 and 12. The outputs of the amplitude detectors, representing the signals $E_1$ and $E_2$, including all error sources, are supplied to squaring circuits 14 and 16 resulting in the signals $E_1^2$ and $E_2^2$. Signals $E_1^2$ and $E_2^2$ are then summed in a summer 18, to produce the signal $P^2$, which is then displayed on a suitable display device 20, such as a high speed oscilloscope having a bandwidth of greater than 10 MHz.

The aim of the invention is to reduce the displayed signal to substantially a horizontal straight line, as shown at 21, which indicates that all error sources have been compensated.

In order to do this, the signal $p^2$ is displayed on the display device as a function of the angle $\Theta_m$. An oscilloscope operated in the X-Y mode and having a 10 MHz bandwidth can be used for this purpose. The X channel is a signal related to $\Theta_m$ or time and the Y channel is the amplitude information.

Figure 2:
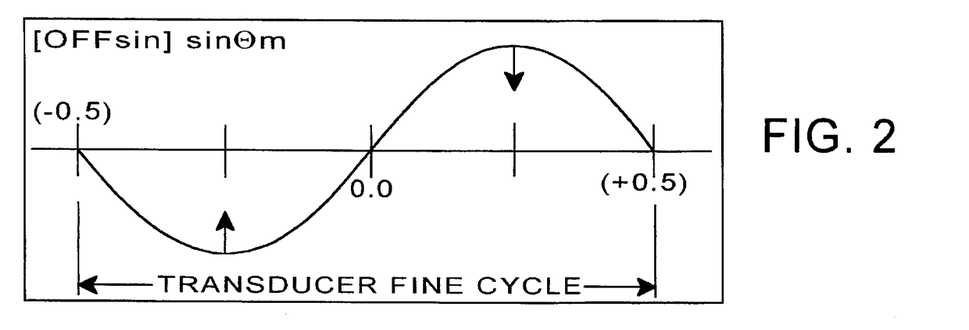
FIG. 2 shows how an offset encoding error from one channel of an angular position encoder appears on an oscilloscope.

The typical error sources which are encountered in angular position encoders include an offset error in the sin signal from channel 1 and an offset error in the cos signal from channel 2, referring to FIG. 1. An offset in the sin signal has been represented in equation 1 above as OFFsin. This offset error will produce an encoding error in the $P^2$ signal of OFFsin*$\sin\Theta_m$ at the fundamental frequency, as shown in FIG. 2. The X axis represents fractions of the encoder cycle with respect to the reference angle, set at 0. In other words, the X axis represents the instantaneous value of the angle $\Theta_m$.

This offset error can be reduced by making suitable adjustments to the signal from channel 1 of the encoder such that the values at the arrows in FIG. 2 are the same. In this way, it is ensured that the error source OFFsin is a constant known value. This error can be cancelled by the introduction into channel 1 of a compensating signal. Another compensating signal can be introduced into channel 2. Alternatively, a compensating signal can be introduced into only one of the channels once the delta offset between the channels is known.

Figure 3:
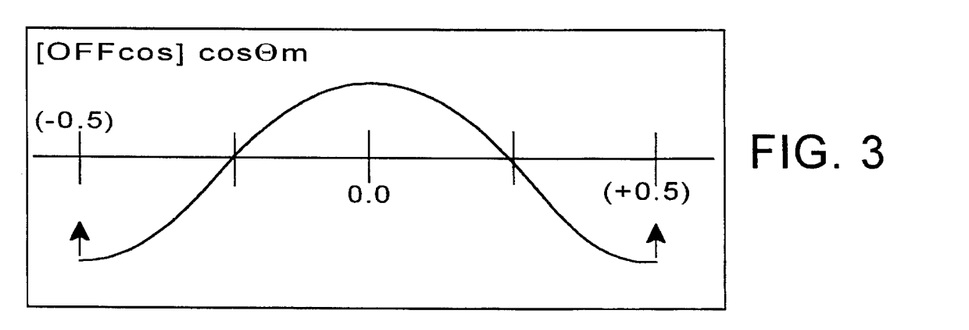
FIG. 3 shows how an offset encoding error from another channel of an angular position encoder appears on an oscilloscope.

FIG. 3 shows an offset error in the cos signal from channel 2. This error will also produce an encoding error at the fundamental frequency. This error is displayed the same way and can be reduced by the same procedure employed for the sin channel. Thus, the values at the arrows in FIG. 3 are made the same.

Figure 4:
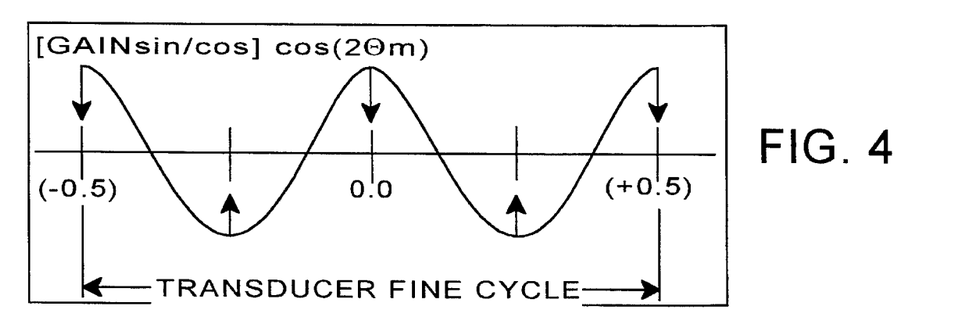
FIG. 4 shows how a gain difference error between two channels from an angular position encoder appears on an oscilloscope.

FIG. 4 shows a GAIN difference error between the sin and cos channels as shown in the formula for $E_2$. The quantity GAIN is the difference between the sin and cos channel amplitude signals and is added to or subtracted from the amplitude of one of the two channels, in this case, the cos channel signal. It could be added or subtracted from either channel, and adjustment of the GAIN in either channel (GAINsin or GAINcos) made to reduce the error by making the values at the arrorws in FIG. 4 the same. The GAIN difference results in a second harmonic encoding error in the $P^2$ signal, as shown by equation 2 above and in FIG. 4. As shown in equation (1) above, the actual cos channel gain is A(1+GAIN), such that the compensated gain (1+GAIN) has a range between 0 and 2. It is generally desirable to make negative GAIN adjustments to the corresponding sin or cos channel that reduces the error. This guarantees that the encoder output phasor amplitude will be reduced and that the GAIN adjusted variable will not saturate its fixed point range. As discussed, to reduce the GAIN error, the values at the arrows in FIG. 4 are made the same.

Figure 5:
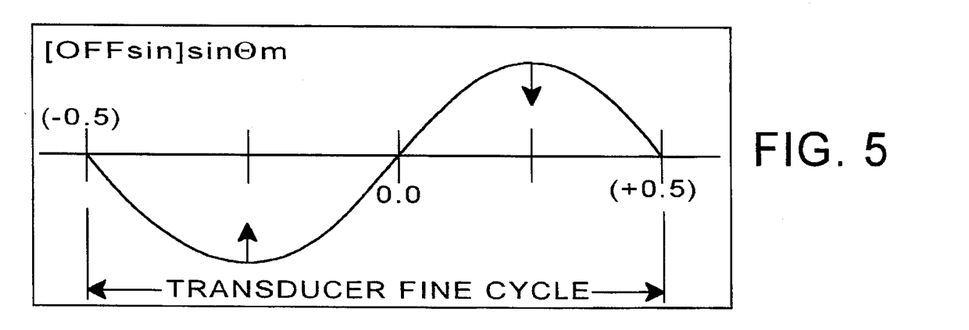
FIG. 5 shows how a coupling error between the two channels of an angular position encoder appears on an oscilloscope.

FIG. 5 shows a coupling error between the sin and cos channels. This error may occur in the interconnecting cables or directly in the measurement encoder. Coupling results in a second harmonic encoding error which has a quadrature phase characteristic. To reduce this error, the values at the arrows are made the same. This parameter is generally very small and often negligible for many angular position encoders. However, some resolvers may exhibit a very large coupling component.

The above displays of the four error signals can then be repeated to further minimize the errors, increasing the oscilloscope gain each time as the errors get smaller. When the display trace is a straight line with only noise remaining, then the compensation procedure is complete.

Note that in each of FIGS. 2 to 5, the possible error sources in the sum signal have been shown separately. In fact, the sum signal may have errors from all or only some of these error sources. Accordingly, each error source should be compensated as described above until the accumulated errors approach zero, this event being determined by the sum signal approaching a constant value, e.g., a straight line display on the display device.

Certain residual systematic errors may come and go as a function of the encoder angular position. This is the result of manufacturing imperfections of the encoder. Selecting calibration values that minimize the error function on the average is the best that can be achieved by the above described procedure.

In order to compensate the encoder output signals, calibration values for the two offsets, gain and cross channel coupling errors must be determined. This can be done by discrete measurements of the phasor $p^2$ amplitude. Phasor amplitude data is measured at specific encoder positions and correction values are computed for the four characteristic errors at the specific positions. These values are then stored and used to compensate the signals from the encoders on subsequent uses of the encoder.

The invention thus provides a method and apparatus for determining the nature of an inaccuracy in an amplitude encoded angular position signal by squaring the amplitude components of the signals, summing the squared signals, monitoring the sum signal, generating an error signal from the sum signal and using the error signal to compensate the amplitude components. The error signal can be used to adjust the position encoder either manually, or optimally, on a realtime, automatic basis.

Figure 7:
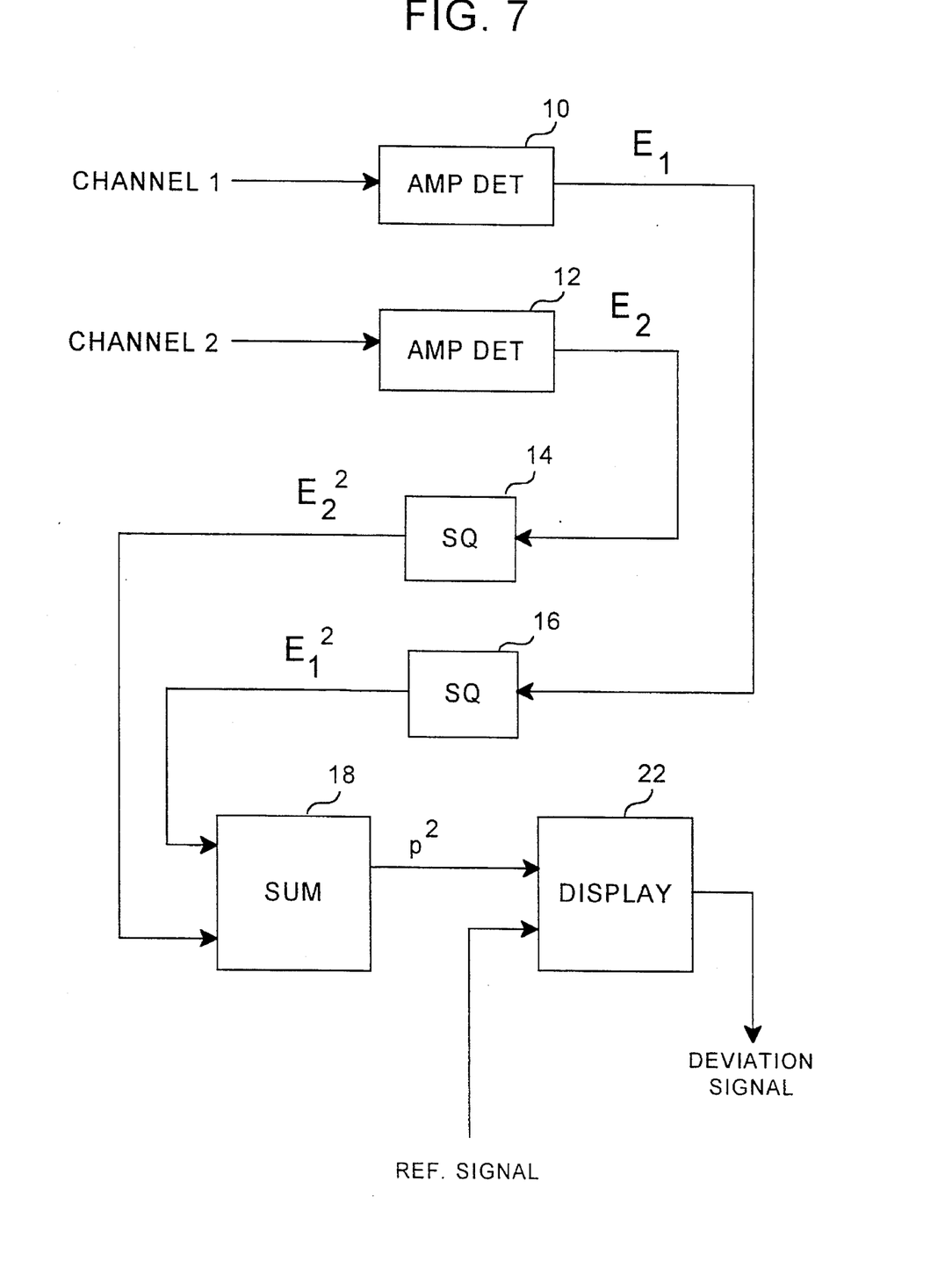
FIG. 7 shows an implementation of an automatic system for determining and correcting for errors in an angular position encoder according to the present invention.

A simple circuit for generating the error signal is shown in FIG. 7. The outputs from the two channels of the angular position encoder are fed to two amplitude detectors 10 and 12. These amplitude detectors detect the amplitudes of the angular position signals, including the error signals. The outputs from the amplitude detectors are fed to respective squarers 14 and 16. The outputs from the squarers are coupled to a summing circuit 18 which forms the signal $p^2$. The signal $P^2$ is fed to a comparator 22 which compares the signal to a reference signal and generates a deviation signal when the input deviates from the reference signal. This process is performed incrementally at specific positions of the encoder through its full 360° cycle. The amount of the deviation for each position is stored in an accumulator and can then be supplied to a compensation means which provides a signal which compensates the error signal at each position.

The invention can be implemented in hardware or can be performed by software contained within a computer, or a combination of both.

Figure 8A:
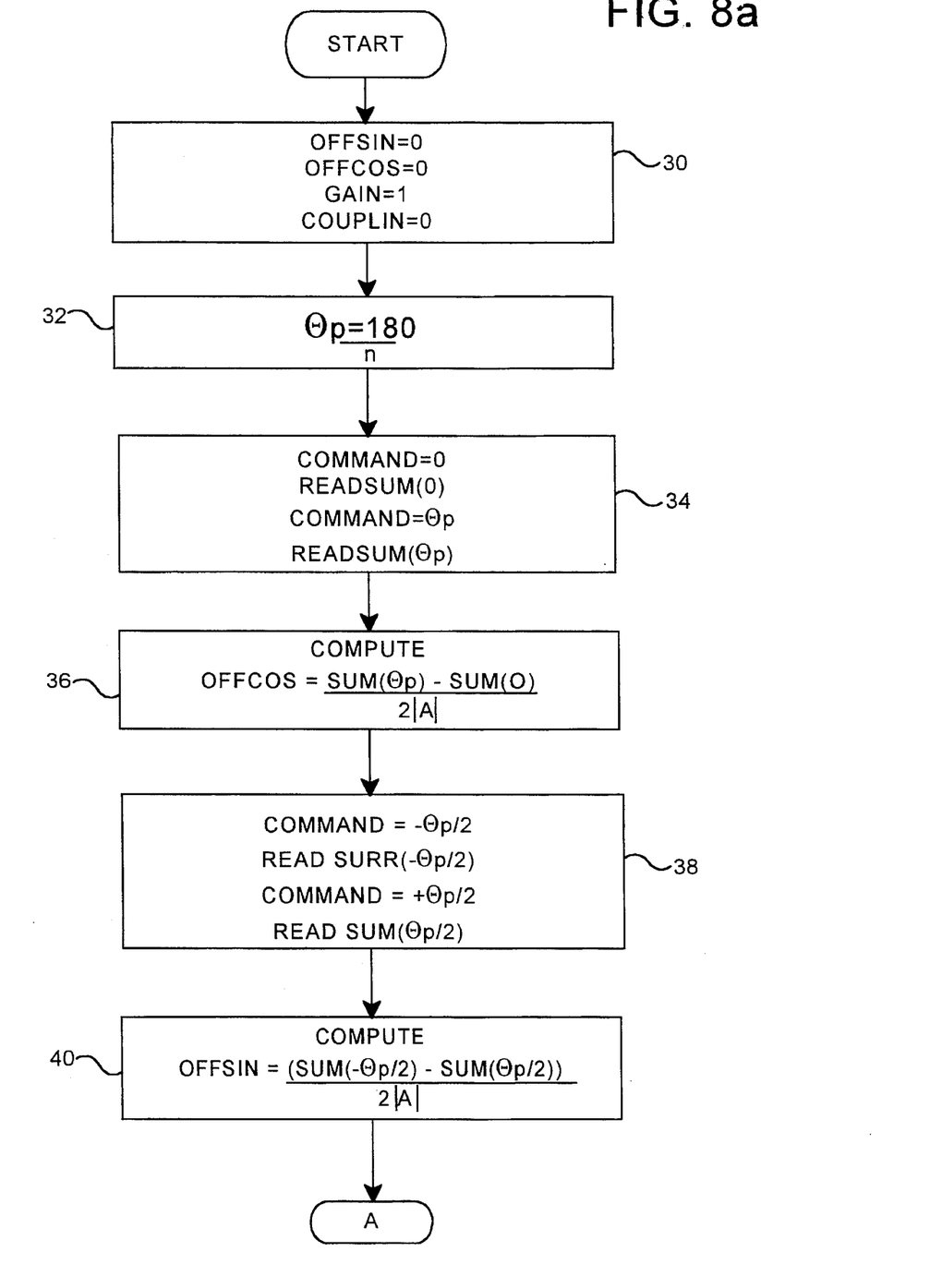
FIGS. 8a and 8b, combined, are a flowchart showing the processing performed in implementing the calibration technique according to the invention.
Figure 8B:
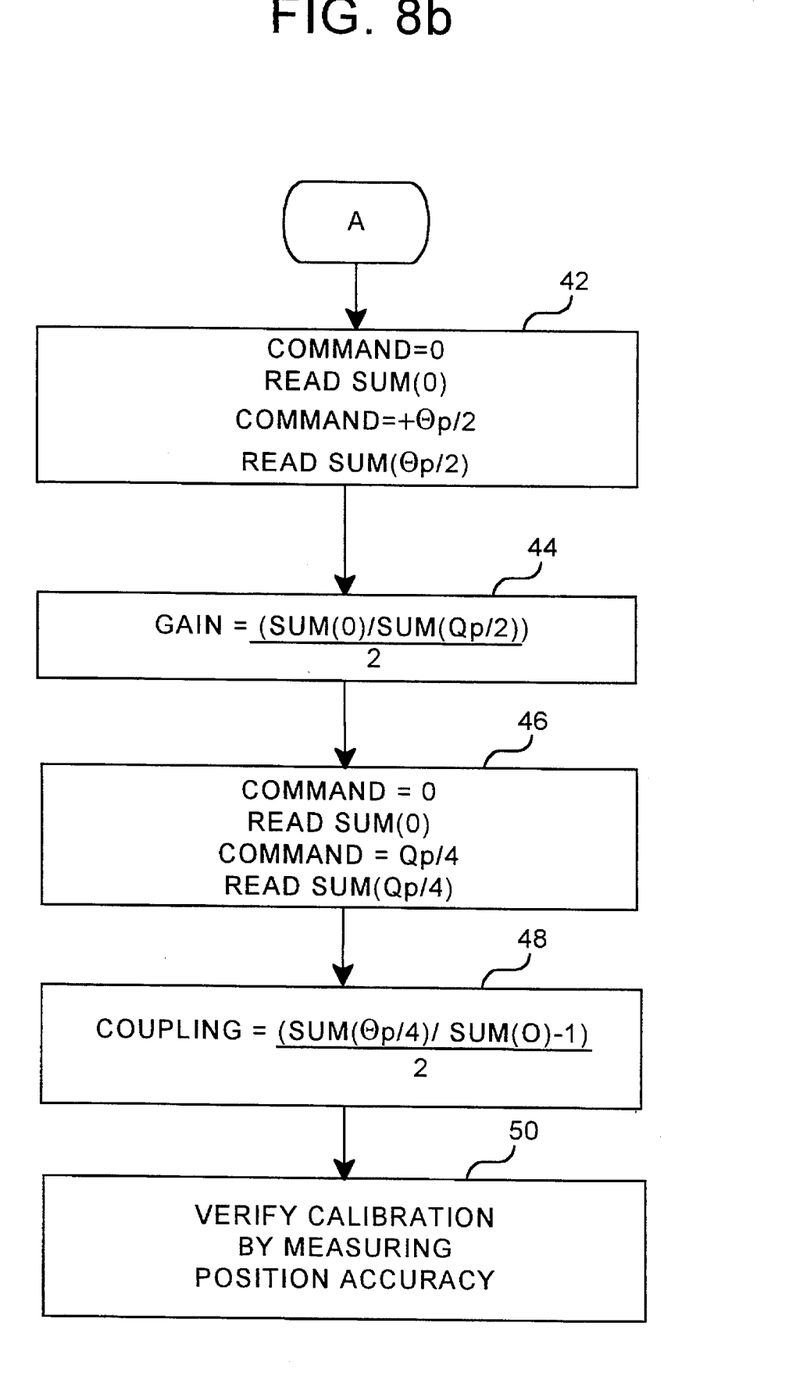

FIGS. 8a and 8b show the flowchart utilized by software implementing the invention. A general purpose computer can be used to implement the flow shown in FIGS. 8a and 8b.

In FIGS. 8a and 8b, the following definitions are used:

$\theta m$ = Mechanical transducer angle
$\theta p$ = Peak of transducer range
$N$ = Transducer speed = number of poles /2
OFFsin = Sine channel offset
OFFcos = Cosine channel offset
GAIN = Relative gain
COUPLING = Cross coupling
SUM = Phasor amplitude sum signal
     = $A^2(\text{Sin}^2 + \text{Cos}^2)$
$A$ = Nominal peak amplitude of transducer feedback signal Turning first to FIG. 8a, the first step is the initialization of the system software at 30. At step 32, $\Theta p$ is set to 180°/N. At step 34, the cosine offset phasor deviation is measured, and at 36, the cosine channel offset OFFcos is computed. At step 38, the sine offset phasor deviation is measured, and at step 40, the sine channel offset OFFsin is computed. The flow then proceeds to FIG. 8b, where at step 42, the relative gain phasor deviation is measured. The GAIN signal is then computed at step 44. The coupling phasor deviation is measured at step 46 and the COUPLING error computed at step 48. At step 50, the calibration is verified by measuring the positional accuracy of the transducer. This can be done manually or automatically by comparing the transducer angular position to the compensated encoded angular position.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for determining and correcting for an error in an amplitude encoded periodic signal, comprising:

receiving two such amplitude encoded periodic signals, each periodic signal having a sinusoidal amplitude component signal, the sinusoidal amplitude component signals being quadrature related;

mathematically squaring the quadrature related sinusoidal amplitude component signals to produce two mathematically squared signals;

summing the squared signals to produce a sum signal; and utilizing the sum signal to determine if an error is present, and if so, to compensate at least one of the two sinusoidal amplitude component signals for the error.

2. The method recited in claim 1, further comprising the step of generating a deviation signal from the sum signal and wherein the step of utilizing the sum signal further comprises using the deviation signal to compensate at least one of the two sinusoidal amplitude component signals.

3. The method recited in claim 1, wherein the step of utilizing the sum signal comprises monitoring the sum signal and manually compensating at least one of the two sinusoidal amplitude component signals for the error.

4. The method recited in claim 1, wherein said step of utilizing the sum signal comprises automatically monitoring the sum signal and automatically compensating at least one of the two sinusoidal amplitude component signals for the error.

5. The method recited in claim 2, wherein said step of using the deviation signal comprises manually using the deviation signal to compensate at least one of the two sinusoidal amplitude component signals.

6. The method recited in claim 2, wherein said step of using the deviation signal comprises automatically using the deviation signal to compensate at least one of the two sinusoidal amplitude component signals.

7. The method recited in claim 2, wherein the step of generating the deviation signal comprises comparing the sum signal to a predetermined reference value and generating said deviation signal as a difference signal.

8. The method recited in claim 1, wherein the amplitude encoded periodic signal is a position signal from an angular position encoder having a cycle and the step of utilizing the sum signal comprises comparing the sum signal to a predetermined reference value at specific times during the cycle of the angular position encoder and storing compensation values at each of said specific times for correcting at least one of the two sinusoidal amplitude component signals.

9. The method recited in claim 1, wherein the error comprises one of an offset error, a gain difference error and cross coupling error between said two amplitude encoded periodic signals.

10. The method recited in claim 1, further comprising monitoring the sum signal by displaying the sum signal on an oscilloscope display device, and further wherein said step of utilizing comprises providing a compensation signal to at least one of the two sinusoidal amplitude component signals to reduce the display on said display device substantially to a straight line.

11. Apparatus for determining and correcting for an error in an amplitude encoded periodic signal, comprising:

means for receiving two such amplitude encoded periodic signals, each periodic signal having a sinusoidal amplitude component signal, the sinusoidal amplitude component signals being quadrature related;

means for mathematically squaring the quadrature related sinusoidal amplitude component signals to produce two mathematically squared signals;

means for summing the squared signals to produce a sum signal; and means for utilizing the sum signal to determine if an error is present, and if so, to compensate at least one of the two sinusoidal amplitude component signals for the error.

12. The apparatus recited in claim 11, further comprising means for generating a deviation signal from the sum signal and wherein the means for utilizing the sum signal further comprises means using the deviation signal for compensating at least one of the two sinusoidal amplitude component signals.

13. The apparatus recited in claim 11, wherein the means for utilizing the sum signal comprises means for monitoring the sum signal and means for manually compensating at least one of the two sinusoidal amplitude component signals for the error.

14. The apparatus recited in claim 11, wherein said means for utilizing the sum signal comprises means for automatically monitoring the sum signal and automatically compensating at least one of the two sinusoidal amplitude component signals for the error.

15. The apparatus recited in claim 12, wherein said means using the deviation signal comprises means for manually using the deviation signal to compensate at least one of the two sinusoidal amplitude component signals.

16. The apparatus recited in claim 12, wherein said means for using the deviation signal comprises means for automatically using the deviation signal to compensate at least one of the two sinusoidal amplitude component signals.

17. The apparatus recited in claim 12, wherein the means for generating the deviation signal comprises means for comparing the sum signal to a predetermined reference value and generating the deviation signal.

18. The apparatus recited in claim 11, wherein the amplitude encoded signal is a position signal from an angular position encoder having a cycle and the means for utilizing the sum signal comprises means for comparing the sum signal to a predetermined reference value at specific times during the cycle of the angular position encoder and means for storing compensation values at each of said specific times for correcting at least one of the two sinusoidal amplitude component signals.

19. The apparatus recited in claim 11, further comprising means for monitoring the sum signal comprising an oscilloscope display device.

20. The apparatus recited in claim 11, wherein the error comprises one of an offset error, a gain difference error and cross coupling error between said two amplitude encoded periodic signals.

21. The apparatus recited in claim 19, wherein said means for utilizing comprises means for providing a compensation signal to at least one of the two sinusoidal amplitude component signals to reduce the display on said display device substantially to a straight line.

22. A method for determining the nature of an error in an amplitude encoded periodic signal, comprising:

receiving two such amplitude encoded periodic signals, each periodic signal having a sinusoidal amplitude component signal, the sinusoidal amplitude component signals being quadrature related;

mathematically squaring the quadrature related sinusoidal amplitude component signals to produce two mathematically squared signals;

summing the squared signals to produce a sum signal; and monitoring the sum signal and determining the nature of the error based on said sum signal.

23. The method recited in claim 22, further comprising the step of utilizing the sum signal to compensate at least one of the two sinusoidal amplitude component signals for the error.

24. The method recited in claim 23, further comprising the step of generating a deviation signal from the sum signal and wherein the step of utilizing the sum signal further comprises using the deviation signal to compensate at least one of the two sinusoidal amplitude component signals.

25. The method recited in claim 23, wherein the step of monitoring the sum signal comprises manually viewing the sum signal on a display device and the step of utilizing comprises manually compensating at least one of the two sinusoidal amplitude component signals for the error.

26. The method recited in claim 23, wherein said step of monitoring the sum signal comprises automatically monitoring the sum signal and the step of utilizing comprises automatically compensating at least one of the two sinusoidal amplitude component signals for the error.

27. The method recited in claim 24, wherein said step of using the deviation signal comprises manually using the deviation signal to compensate at least one of the two sinusoidal amplitude component signals.

28. The method recited in claim 24, wherein said step of using the deviation signal comprises automatically using the deviation signal to compensate at least one of the two sinusoidal amplitude component signals.

29. The method recited in claim 24, wherein the step of generating the deviation signal comprises comparing the sum signal to a predetermined reference value and generating said deviation signal as a difference signal.

30. The method recited in claim 23, wherein the amplitude encoded periodic signal is a position signal from an angular position encoder having a cycle and the step of utilizing the sum signal comprises comparing the sum signal to a predetermined reference value at specific times during the cycle of the angular position encoder and storing compensation values at each of said specific times for correcting at least one of the two sinusoidal amplitude component signals.

31. The method recited in claim 22, wherein the error comprises one of an offset error, a gain difference error and cross coupling error between said two amplitude encoded periodic signals.

32. The method recited in claim 31, wherein said step of monitoring the sum signal comprises monitoring the waveform of the sum signal and determining the nature of the error based on said waveform, each of said errors being associated with a characteristic waveform.

33. The method recited in claim 23, wherein the step of utilizing the sum signal comprises compensating at least one of said amplitude component signals so that said sum signal approaches a constant value.

34. The method recited in claim 23, wherein the step of monitoring the sum signal comprises displaying the sum signal on an oscilloscope display device, and further wherein said step of utilizing comprises providing a compensation signal to at least one of the two sinusoidal amplitude component signals to reduce the display on said display device substantially to a straight line.

35. Apparatus for determining the nature of an error in an amplitude encoded periodic signal, comprising:

means for receiving two such amplitude encoded periodic signals, each periodic signal having a sinusoidal amplitude component signal, the sinusoidal amplitude component signals being quadrature related;

means for mathematically squaring the quadrature related sinusoidal amplitude component signals to produce two mathematically squared signals;

means for summing the squared signals to produce a sum signal; and means for monitoring the sum signal and determining the nature of the error based on said sum signal.

36. The apparatus recited in claim 35, further comprising means for utilizing the sum signal to compensate at least one of the two sinusoidal amplitude component signals for the error.

37. The apparatus recited in claim 36, further comprising means for generating a deviation signal from the sum signal and wherein the means for utilizing the sum signal further comprises means using the deviation signal for compensating at least one of the two sinusoidal amplitude component signals.

38. The apparatus recited in claim 36, wherein the means for monitoring the sum signal comprises display means for manually viewing the sum signal and the means for utilizing comprises means for manually compensating at least one of the two sinusoidal amplitude component signals for the error.

39. The apparatus recited in claim 36, wherein said means for monitoring the sum signal comprises means for automatically monitoring the sum signal and the means for utilizing comprises means for automatically compensating at least one of the two sinusoidal amplitude component signals for the error.

40. The apparatus recited in claim 37, wherein said means using the deviation signal comprises means for manually using the deviation signal to compensate at least one of the two sinusoidal amplitude component signals.

41. The apparatus recited in claim 37, wherein said means for using the deviation signal comprises means for automatically using the deviation signal to compensate at least one of the two sinusoidal amplitude component signals.

42. The apparatus recited in claim 37, wherein the means for generating the deviation signal comprises means for comparing the sum signal to a predetermined reference value and generating the deviation signal.

43. The apparatus recited in claim 36, wherein the amplitude encoded signal is a position signal from an angular position encoder having a cycle and the means for utilizing the sum signal comprises means for comparing the sum signal to a predetermined reference value at specific times during the cycle of the angular position encoder and means for storing compensation values at each of said specific times for correcting at least one of the two sinusoidal amplitude component signals.

44. The apparatus recited in claim 35, wherein the means for monitoring the sum signal comprises an oscilloscope display device.

45. The apparatus recited in claim 36, wherein the error comprises one of an offset error, a gain difference error and cross coupling error between said two amplitude encoded periodic signals.

46. The apparatus recited in claim 45, wherein the means for monitoring the sum signal comprises means for monitoring the waveform of the sum signal and determining the nature of the error based on the waveform, each of said errors being associated with a characteristic waveform.

47. The apparatus recited in claim 36, wherein the means for utilizing the sum signal comprises means for compensating at least one of the amplitude component signals so that the sum signal approaches a constant value.

48. The apparatus recited in claim 44, wherein said means for utilizing comprises means for providing a compensation signal to at least one of the two sinusoidal amplitude component signals to reduce the display on said display device substantially to a straight line.

49. A method for determining and correcting for an error in the amplitudes of two amplitude encoded quadrature related periodic signals, the amplitudes of said periodic signals each defining sinusoidal functions of an angular measurement signal corrupted by said error and the angular measurement signal being determinable from a mathematical relationship relating said amplitudes, the method comprising:

receiving said two amplitude encoded periodic signals;

mathematically squaring the quadrature related sinusoidal amplitudes to produce two mathematically squared signals;

summing the squared signals to produce a sum signal;

analyzing the sum signal to determine the type of error present by comparing the sum signal to a constant value signal; and providing a compensation signal to at least one of the sinusoidal amplitudes to compensate for the error.

50. Apparatus for determining and correcting for an error in the amplitudes of two amplitude encoded quadrature related periodic signals, the amplitudes said periodic signals each defining sinusoidal functions of an angular measurement signal corrupted by said error and the angular measurement signal being determinable from a mathematical relationship relating said amplitudes, the apparatus comprising:

means for receiving said two amplitude encoded periodic signals;

means for mathematically squaring the quadrature related sinusoidal amplitudes to produce two, squared signals;

means for summing the mathematically squared signals to produce a sum signal;

means for analyzing the sum signal to determine the type of error present by comparing the sum signal to a constant value signal; and means for providing a compensation signal to at least one of the sinusoidal amplitudes to compensate for the error.

51. A method for determining and correcting for an error in an amplitude encoded periodic signal, comprising:

receiving two such amplitude encoded periodic signals, each periodic signal having a sinusoidal amplitude component signal, the sinusoidal amplitude component signals being quadrature related;

mathematically squaring the quadrature related sinusoidal amplitude component signals to produce two mathematically squared signals;

summing the squared signals to produce a sum signal;

monitoring the sum signal by displaying the sum signal on an oscilloscope display device; and utilizing the sum signal to determine if an error is present, and if so, to compensate at least one of the two sinusoidal amplitude component signals for the error, said step of utilizing comprising providing a compensation signal to at least one of the two sinusoidal amplitude component signals to reduce the display on said display device substantially to a straight line.

52. Apparatus for determining and correcting for an error in an amplitude encoded periodic signal, comprising:

means for receiving two such amplitude encoded periodic signals, each periodic signal having a sinusoidal amplitude components signal, the sinusoidal amplitude component signals being gradrature related;

means for mathematically squaring the quadrature related sinusoidal amplitude components signals to produce two mathematically squared signals;

means for summing the squared signals to produce a sum signal;

means comprising an oscilloscope display device for monitoring the sum signals; and means for utilizing the sum signal to determine if an error is present, and if so, to compensate at least one of the two sinusoidal amplitude component signals for the error, said means for utilizing comprising means for providing a compensation signal to at least one of the two sinusoidal amplitude component signals to reduce the display on the display device substantially to a straight line.

* * * * *